United States Patent
Chang et al.

(10) Patent No.: US 6,350,694 B1
(45) Date of Patent: Feb. 26, 2002

(54) REDUCING CMP SCRATCH, DISHING AND EROSION BY POST CMP ETCH BACK METHOD FOR LOW-K MATERIALS

(75) Inventors: Weng Chang, Taipei; Tien-I Bao; Syun-Ming Jang, both of Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/814,038

(22) Filed: Mar. 22, 2001

(30) Foreign Application Priority Data

Oct. 4, 2000 (JP) .......................... 2000-304520

(51) Int. Cl.⁷ ...................... H01L 21/302; H01L 21/311
(52) U.S. Cl. ...................... 438/692; 438/697; 438/700; 438/723
(58) Field of Search .................. 438/692, 694, 438/697, 699, 706, 723, 658, 672, 681, 674, 700

(56) References Cited

U.S. PATENT DOCUMENTS

| | | | |
|---|---|---|---|
| 6,008,540 A | * 12/1999 | Lu et al. | 257/758 |
| 6,010,962 A | 1/2000 | Liu et al. | 438/687 |
| 6,037,013 A | * 3/2000 | Hsu et al. | 427/535 |
| 6,043,149 A | 3/2000 | Jun | 438/658 |
| 6,117,775 A | 9/2000 | Kondo et al. | 438/690 |
| 6,136,680 A | 10/2000 | Lai et al. | 438/597 |
| 6,140,240 A | 10/2000 | Yang et al. | 438/692 |
| 6,214,423 B1 | * 4/2001 | Lee et al. | 427/492 |
| 6,265,303 B1 | * 7/2001 | Lu et al. | 428/623 |

* cited by examiner

Primary Examiner—Michael S. Lebentritt
(74) Attorney, Agent, or Firm—George O. Saile; Stephen B. Ackerman

(57) ABSTRACT

A new plasma etch back is provided that is applied to the surface of a low-k dielectric after the process of CMP of a copper surface has been completed. The copper surface is the surface of interconnect metal, the interconnect metal is embedded in the layer of low-k dielectric.

22 Claims, 3 Drawing Sheets

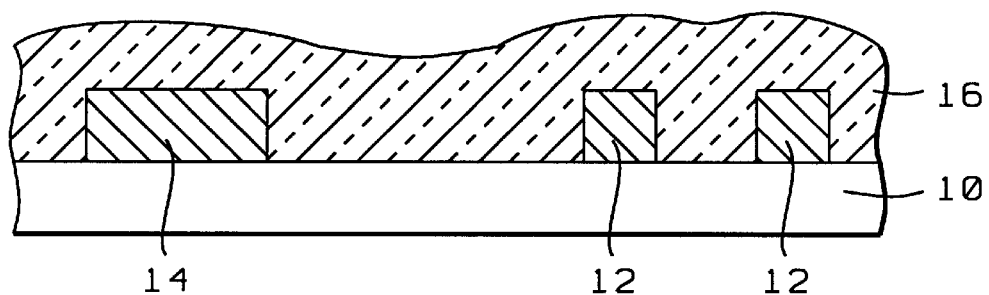
*FIG. 1 - Prior Art*
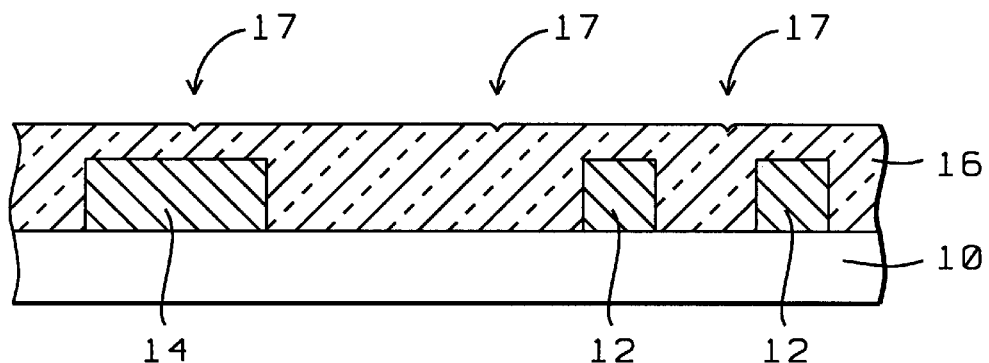
*FIG. 2 - Prior Art*
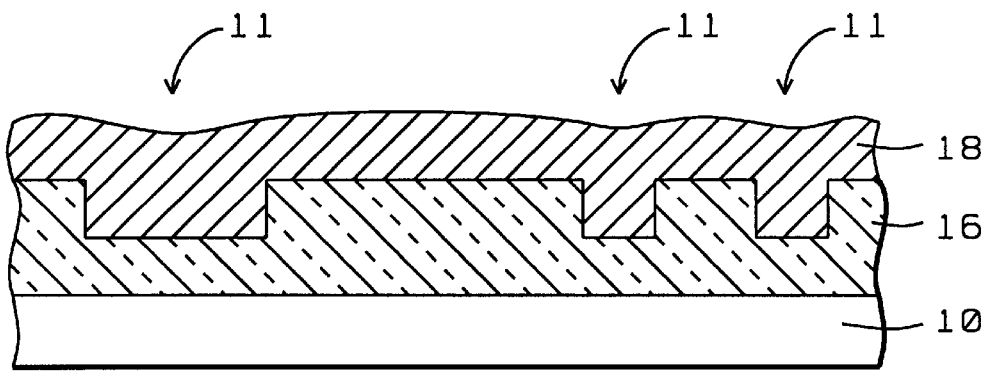
*FIG. 3 - Prior Art*

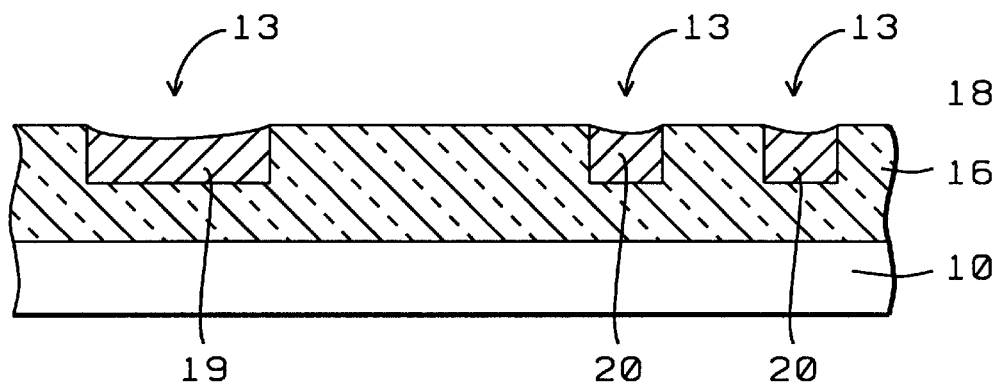
*FIG. 4 - Prior Art*
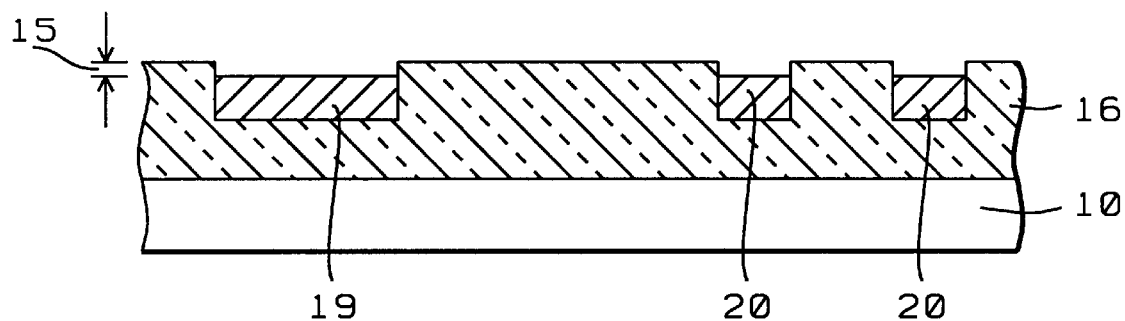
*FIG. 5 - Prior Art*

REDUCING CMP SCRATCH, DISHING AND EROSION BY POST CMP ETCH BACK METHOD FOR LOW-K MATERIALS

BACKGROUND OF THE INVENTION (1) Field of the Invention

The invention relates to the fabrication of integrated circuit devices, and more particularly, to a method of reducing surface damage after the process of Chemical Mechanical Polishing (CMP) has been completed.

(2) Description of the Prior Art

Current semiconductor technology continues to improve device performance by reducing device feature dimensions and by providing denser packaging for the devices, reducing the length of inter-device interconnects. Parasitic influences are therewith reduced as are induced ohmic losses over interconnect lines.

Semiconductor device technology has progressed from Large Scale Integration (LSI) through Very Large Scale Integration (VLSI) to the present Ultra Large Scale Integration (ULSI). This technological evolution has affected not only devices and device features but has in addition greatly affected the manner and methods that are used to interconnect semiconductor devices and to package these devices once the devices are created.

Semiconductor devices that are created using VLSI technology contain a large variety of semiconductor and electrical components such as transistors of significantly different designs, resistors, capacitors and inductors that are formed on a chip that also contains digital processing capabilities, digital devices and analog devices with hybrid devices that process both digital and analog data. All of these devices however have in common that devices and device features must be interconnected before the device can be considered a complete, functional device. Processing dimensions of patterns that are created for the purpose of creating a semiconductor device have been decreasing year by year and are approaching submicron dimensions. Key to the creation of good interconnect metal is the planarity or surface flatness of the interconnect metal. This aspect of the creation of interconnect lines takes on even more urgency in applications where multiple layers of interconnect lines and line patterns are superimposed. Lack of planarity in a lower layer is in those cases further multiplied, this to the point where higher layers of interconnect become impossible to create (due to poor depth of focus for the photolithographic process that is required for the creation of these layers). To address this problem of surface planarity, a method of planarization, that is Chemical Mechanical Polishing or CMP, has been developed. A CMP technique is one of the techniques that has been developed to meet strict requirements for surface planarity as it applies to further device miniaturization. This technique is essential in performing planarization of insulating layers that are formed between overlying layers of conducting interconnect lines, for the formation of plugs, for the formation of buried metal interconnections and for the isolation of buried elements in semiconductor devices. The process of CMP is used to planarize semiconductor slices prior to the fabrication of semiconductor circuitry thereon, and is also used to remove high elevation features created during the fabrication of the microelectronic circuitry on the substrate.

The use of chemical mechanical polishing to planarize semiconductor substrates has not met with universal acceptance, particularly where the process is used to remove high elevation features created during the fabrication of microelectronic circuitry on the substrate. One primary problem, which has limited the used of chemical mechanical polishing in the semiconductor industry, is the limited ability to predict, much less control, the rate and uniformity at which the process will remove material from the substrate. As a result, CMP is a labor intensive process, because the thickness and uniformity of the substrate must be constantly monitored to prevent over-polishing or inconsistent polishing of the surface of a substrate.

Current polishing practice uses a slurry that is inserted between the polishing medium, such as a polishing pad and the surface that is being polished. The slurry is primarily used to enhance the rate at which selected materials are removed from the substrate surface. It is basic that the slurry must be present in equal amount and having equally abrasive polishing characteristics across the surface that is being polished. This because it is highly desirable that the polishing of a semiconductor surface proceeds in a uniform and even manner across the surface that is being polished. To add further complexity to this requirement it must be realized that the polishing medium and the surface that is being polished are typically urged towards each other in order to enhance the abrasive polishing action. This urging together of the two surfaces makes an even distribution of the slurry that must be present between these surfaces even more difficult. One factor, which contributes to the unpredictability and non-uniformity of the polishing rate of the CMP process, is the non-homogeneous replenishment and therefore the non-homogeneous polishing action of slurry at the surface of the substrate and the polishing pad. The slurry, which is in contact with the substrate, reacts with selected materials on the surface of the substrate. As a result of this reaction the slurry becomes less abrasive and the polishing enhancing characteristics of the slurry are significantly altered. One approach to overcoming this problem is to continuously provide fresh slurry onto the polishing pad. Fresh slurry must, in order to achieve uniform polishing action across a surface, be present across this surface in equal amounts on all points of the polished surface.

In a typical CMP apparatus a polishing pad is attached to a circular polishing table, which rotates at a rate in the order of 1 to 100 m RPM. A wafer carrier is used to hold a wafer face down against the polishing pad. The wafer is held in place by applying a vacuum to the backside of the wafer. The wafer carrier also rotates, usually in the same direction as the polishing table, at a rate on the order of 1 to 100 RPM. Due to the rotation of the polishing table, the wafer traverses a circular polishing path over the polishing pad. A force is also applied in the downward vertical direction against the wafer, which presses the wafer against the polishing pad as it is being polished. The force is typically in the order of 0 to 15 pounds per square inch and is applied by means of a shaft that is attached to the back of wafer carrier. Slurry is provided to the top of the polishing pad to further enhance the polishing action of polishing pad. By carefully selecting the chemical components of the slurry, the polishing process can be made more selective to one type of material than to another. For example, in the presence of potassium hydroxide, silicon dioxide is removed at a faster rate than silicon nitride. The ability to control the selectivity of a CMP process has led to its increased use in the fabrication of complex integrated circuits.

When applying the CMP process to Intra Level Dielectric (ILD) and Inter Metal Dielectric (IMD) that are used for the manufacturing of semiconductor wafers, surface imperfections (micro-scratch) typically present a problem. Imperfections caused by micro-scratches in the ILD and IMD can range from 100 to 1000 EA for 200 mm. wafers, where an imperfection typically has a depth from 500 to 900 Å and a width of from 1000 to 3000 Å.

It is clear that the impact that the presence of micro-scratch has on the surface of an interconnect medium is dependent on the size of the interconnect medium. For the larger size devices within the semiconductor wafer, with dimensions of the interconnect lines of 0.35 $\mu$m or larger, the impact of micro-scratch may be relatively mild. For device sizes in the semiconductor wafer of 0.25 $\mu$m or less, micro-scratch may result in relative large imperfections in the surface of the wafer, large with respect to the size of the semiconductor devices. These imperfections will cause shorts between the metal lines in the devices while the imperfections also have a severe negative impact on device yield and device reliability.

While copper has become important for the creation of multilevel interconnections, copper lines frequently show damage after CMP and clean. This in turn causes problems with planarization of subsequent layers that are deposited over the copper lines, since these layers may now be deposited on a surface of poor planarity. Isolated copper lines or copper lines that are adjacent to open fields are susceptible to damage. Poor copper gap fill together with subsequent problems of etching and planarization are suspected to be the root causes of these problems. Where over-polish is required, the problem of damaged copper lines becomes even more severe.

CMP scratch, surface dishing and surface erosion are critical aspects of surface planarization for the environment where dielectrics (in which an interconnect pattern is created) having a low-k dielectric constant are used with copper as an interconnect metal. Oxide has long been used as an Intra Metal Dielectric (IMD) or Inter Level Dielectric (ILD), oxide is more resistant to the process of CMP due to its (harder) molecular structure. Dielectrics that have a low-k dielectric constant are typically softer than oxide and therefore have different polishing characteristics than oxide when subjected to the process of CMP. The invention addresses the concern of polishing copper surfaces that are created in and therefore surrounded by low-k dielectric materials.

Referring now to FIG. 1, there is shown a cross section of a semiconductor surface 10 over the surface of which a pattern of interconnect lines 12 has been created, pattern 14 has been highlighted as part of the interconnect metal that has been created on the surface of layer 10. The distinction between patterns 12 and 14 is made in order to highlight the difference in CMP characteristics that may arise due to the difference in pattern density between patterns 12 and 14. Semiconductor surface 10 is typically the surface of a silicon semiconductor substrate, interconnect pattern 12 is typically the pattern of interconnect lines while pattern 14 is typically the pattern of a contact pad. A layer 16 of dielectric has been deposited over the semiconductor surface 10, including the surface of the interconnect pattern 12 and 14. Due to the difference in pattern density between patterns 12 and 14, it is to be expected that removal or polishing of the layer 16 of dielectric proceeds differently in the surface region of layer 16 that overlays pattern 12 as opposed to the surface region that overlays pattern 14. Also, layer 16 must be deposited to a thickness that is adequate to prevent dishing of the surface of the layer 16 of dielectric in the large surface area of layer 10 that separates the pattern 12 from the pattern 14. It is from this to be expected that it is a challenge to polish the surface of layer 16 in such a manner that good planarity is achieved across the patterns 12 and 14. It is the objective that, after the polishing of the surface of layer 16 has been completed, a thin protective layer remains in place overlying both patterns 12 and 14. This layer forms the protection of the surface of patterns 12 and 14 against externally introduced damage such as surface corrosion. It is clear that good planarity is required so that following steps of processing, which frequently use photolithography for patterning and etching of the remaining layer, can expose the surface of layer 16 of dielectric in a uniform way (to for instance avoid depth of focus variations across the surface of layer 16) for, for instance the creation of openings in layer 16 through which contact can be established with patterns 12 and 14.

FIG. 2 shows the cross section of the semiconductor surface 10 of FIG. 1, after the layer 16 of dielectric has been polished. The polishing of layer 16 has, as shown in FIG. 2, left a thin layer of dielectric 16 in place overlying the metal patterns 12 and 14. Also shown in FIG. 2 is the presence of surface irregularities 17, most frequently referred to as surface scratch, that are caused by any interference with a uniform removal of layer 16. Such interference may take the form of slurry irregularities, disturbances or impurities in the surface of the polishing pad and the like. Since irregularities 17 can lead to problems, some of which have previously been highlighted, during subsequent processing of the semiconductor surface 10, these irregularities must be avoided.

FIG. 3 shows a cross section of a semiconductor surface 10, a layer 16 of dielectric has been deposited over the semiconductor surface 10, trenches 11 have been created in the layer of dielectric. A layer 18 of metal has been deposited over the surface of the layer 16 of dielectric, filling the trenches 11 created in layer 16. Layer 10 is typically a semiconductor surface but can also be a layer of insulation. Polishing of the surface of layer 18 of metal, in the case of the invention comprising copper, proceeds by first removing high points form the surface of layer 18 after which the polishing proceeds over the now relatively flat surface of the remaining layer 18 of metal. After the surface of the layer 16 is reached, the abrasive action of the polishing pad and the therewith provided slurry is shared between the metal layer 18 and the surface of the layer 16 of dielectric. The polishing rate of these two surfaces is not equal. In the polishing of a layer 18 of copper, which is addressed by the invention, the copper is removed at a faster rate that the layer 16 of dielectric which, in the application of the invention, comprises a low-k dielectric. This leads to the non-planar or dished surfaces 13 that are shown in cross section for the metal patterns 19 (for a contact pad) and 20 (for interconnect lines).

This effect of a non-uniform removal of the layer of metal 18 versus the layer 16 of interposed low-k dielectric leads to the cross section that is shown in FIG. 5. It is clear from the cross section that is shown in FIG. 5 that the surface level of the copper patterns 19 and 20 is below the surface of the layer 16 of dielectric by a distance 15. The invention addresses a method to achieve good planarity of the surface of layers 16, 19 and 20.

U.S. Pat. No. 6,140,240 (Yang et al.) provide a method for eliminating CMP induced micro scratches but use a compensatory layer of polymer.

U.S. Pat. No. 6,043,149 (Jun) shows an etch back after a copper CMP, see col. 5, line 43. This patent essentially addresses regular metal etch back such as tungsten etch back. This patent however does not address copper CMP applied to damascene structures.

U.S. Pat. No. 6,136,680 (Lai et al.) shows an argon sputter etch after a copper chemical mechanical polish (CMP). This patent does not address the removal of dielectric film scratch.

U.S. Pat. No. 6,010,962 (Liu et al.) shows a cooper chemical mechanical polish (CMP) process with a Low K IMD layer. This patent uses a compensatory layer to address problems of CMP.

U.S. Pat. No. 6,117,775 (Kondo et al.) and U.S. Pat. No. 6,140,240 (Yang et al.) show related processes. These two patents use a compensatory layer to resolve CMP issues, U.S. Pat. No. 6,117,775 (Kondo et al.) uses condition optimization to optimize the slurry condition.

SUMMARY OF THE INVENTION

A principle objective of the invention is to reduce post CMP dishing, erosion and micro-scratch on the surface of a low-k dielectric in which is embedded a layer of copper interconnect metal.

Another objective of the invention is to provide a method for creating layers of interconnect metal embedded in a low-k dielectric for sub-micron semiconductor devices by eliminating surface irregularities from the surface of the layer of low-k dielectric.

Another objective of the invention is to provide a method of creating copper interconnect metal for sub-micron devices whereby the interconnect metal is embedded in low-k dielectric capable of providing high yield in fabricating the sub-micron devices.

Another objective of the invention is to provide a method of providing good planarity of a low-k dielectric surface in which patterned copper interconnect metal is provided for sub-micron devices.

In accordance with the objectives of the invention, a new plasma etch back is provided that is applied to the surface of a low-k dielectric after the process of CMP of a copper surface has been completed. The copper surface is the surface of interconnect metal, the interconnect metal is embedded in the layer of low-k dielectric.

BRIEF DESCRIPTION OF THE DRAWINGS

FIG. 1 shows a cross section of a semiconductor surface over which a pattern of interconnect lines has been created, a layer of dielectric has been deposited over the semiconductor surface, including the surface of the interconnect lines.

FIG. 2 shows the cross section of the semiconductor surface of FIG. 1, after the layer of dielectric has been polished.

FIGS. 3 through 5 show a cross section of a semiconductor surface over which a layer of metal has been deposited, as follows:

FIG. 3 shows a cross section of a semiconductor surface, a layer of dielectric has been deposited over the semiconductor surface, trenches have been created in the layer of dielectric, a layer of metal has been deposited.

FIG. 4 shows a cross section of the surface of FIG. 3, after the layer of metal has been polished.

FIG. 5 shows the effects of using a slurry that has high polishing selectively of a layer of copper as compared with a layer of low-k dielectric during the process of polishing the surface of the layer of copper.

DESCRIPTION OF THE PREFERRED EMBODIMENTS

The occurrence of surface scratch, dishing and erosion are very critical issues during the process of Chemical Mechanical Polishing (CMP) as this process is applied to a copper damascene structure that is embedded ion a low-k dielectric. This is because low-k dielectric has less hardness and strength when compared with regular oxide. In order to achieve acceptable results for the low-k dielectric with copper damascene process, a direct CMP must be applied to the low-k dielectric, which however results in increased surface scratch, dishing and erosion of the copper damascene structure. To remove these effects of scratch, dishing and erosion, a plasma etch back is performed after the low-k dielectric has been polished. This plasma etch back removes surface scratch and alleviates surface dishing and surface erosion of the copper damascene structure. The plasma etch back processing conditions are dependent on the therefore determined by the type of low-k dielectric material that is being used in which the damascene structure is created. Plasma chemicals that are used for this application are limited to reducing gasses such as $N_2$—$H_2$, He—$H_2$, $NH_3$ and the like. During the process of plasma etch, the gas pressure in the processing chamber is not critical. A plasma gas that contains $O_2$ cannot be used for this plasma etch since the $O_2$ will cause oxidation of the copper surface. In a typical tool that is used for CMP, direct CMP to the surface of the low-k dielectric typically results in surface scratch of the copper damascene structure. Measured dishing and erosion typically is in the range of about 1000 Angstrom for low-k dielectric surfaces that contain organic dielectric such as SiLK. Low-k dielectrics that apply to the invention are organic low-k dielectrics (such as SiLK and FLARE) and inorganic low-k dielectrics (such as black diamond and OSG).

It must in view of the invention be emphasized that in the process of CMP that is applied to the surface of a copper surface that is embedded in a layer of low-k dielectric, the selectivity of the slurry that is used to polish the copper surface is such that, after the process of CMP has been completed, the surface of the copper is lower than the surface of the surrounding low-k dielectric. This despite the fact that the low-k dielectric has a relatively soft surface.

Figure 6:
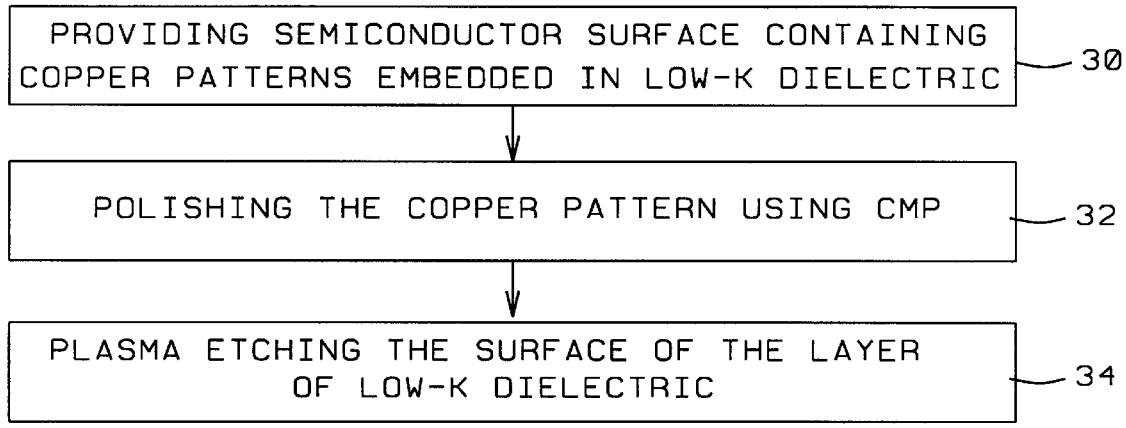
FIG. 6 shows a flow chart of the processing steps of the invention.

Referring now specifically to FIG. 6, there is shown a flow chart of the processing steps that are required under the invention.

The invention starts, FIG. 6 step 10, with a semiconductor surface, a layer of low-k dielectric having been deposited over the semiconductor surface. The layer of dielectric is patterned and etched, creating openings in the layer of dielectric for interconnect metal such as trenches for interconnect lines and openings for contact plugs and vias. A layer of copper has been deposited over the layer of dielectric, filling the openings that have been created in the layer of dielectric with copper while a layer of copper is also deposited on the surface of the layer of low-k dielectric.

As low-k dielectrics to imbed the interconnect pattern of copper can be used, as previously pointed out, an organic dielectric (such as SiLK and FLARE) and inorganic low-k dielectrics (such as black diamond and OSG).

The surface of the deposited layer of copper is next polished, FIG. 6, step 12, using methods of Chemical Mechanical Planarization (CMP), this polishing is performed essentially down to the surface of the layer of low-k dielectric.

The polish that is used for the CMP of the layer of copper uses a slurry that has a high selectivity of polishing for the copper when compared with the etching rate of the layer of low-k dielectric in which the copper interconnect pattern is embedded. This leads to the cross section of the polished surface that has been shown in cross section in FIG. 5, where the surface of the polished layer of low-k dielectric is located above the surface of the polished copper by a distance of 15. In this case, do to the nature of the abrasive action of a chemical mechanical polishing process, the surface of the layer of low-k dielectric is prone to shows surface irregularities (such as scratching and dishing) that must be removed before the process of CMP can be considered successfully completed.

For this reason, the invention applies, FIG. 6, step 14, a plasma etch to the surface of the polished layer of copper including the exposed surface of the layer of dielectric. This plasma etch removes any post-CMP irregularities from the surface of the copper interconnect, resulting in a copper surface that closely approaches the desired surface characteristics, that is scratch free and dishing free while any oxidation that may have formed on the post-CMP surface is also removed.

The plasma etch is preferably applied using reducing gasses such as $N_2$—$H_2$, He—$H_2$, $NH_3$ and the like. Further definition of the reducing gasses cannot be meaningfully be provided since such a definition is dependent on and determined by the interaction between the reducing gasses and the dielectric film that is being removed. The reducing gasses $N_2$—$H_2$ contain components of both $N_2$ and of $H_2$ whereby the mixture and concentration of these components is also dependent on and determined by the interaction between the reducing gasses and the dielectric film that is being removed.

Since the plasma etch is applied in the presence of a copper surface, no oxygen containing plasma gasses can be applied for this plasma etch since oxygen containing gasses affect the surface of the copper pattern resulting in oxidation of the copper. The plasma etch conditions can be specified as being a pressure of between about 1 and 10 Torr, a gas flow rate of between about 500 and 5000 sccm, a temperature of between about 300 and 400 degrees C. and a time of plasma etch between about 10 and 180 seconds, the latter parameter being established by the surface roughness and the dielectric film that is being polished.

As previously mentioned, etching gasses that are used during the plasma etch back are typically gasses such as $N_2$—$H_2$, He—$H_2$, $NH_3$ whereby the selection of the gasses is however determined by the interaction of reactivity and etching characteristics of the dielectric film that is being polished. For a particular low-k dielectric therefore a particular plasma etch back with particular reducing gasses is required. As a result of the plasma etch back, surface scratch, surface dishing and the extent of the occurring erosion can be reduced or removed from the copper surface.

Figure 7:
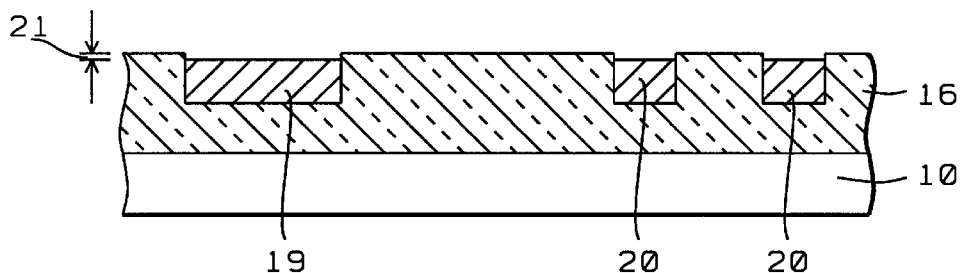
FIG. 7 shows a cross section of the semiconductor surface of FIG. 5 after this surface has been subjected to the plasma etch of the invention.

FIG. 7 shows a cross section of the semiconductor surface 10 after the plasma etch of the invention has been applied to the surface of the polished surface of the layer 16 of low-k dielectric and the copper patterns 19 and 20 that have been shown in cross section in FIG. 5. The essential difference between the prior art FIG. 5 and the cross section that is shown in FIG. 7 is that the height 15, FIG. 5, has been significantly reduced to the height 21 that is shown in FIG. 7. With this reduction in the height of the layer 16 of low-k dielectric, surface irregularities that are present in the surface of layer 16 that have been introduced by polishing have also been removed.

The following processing sequence is followed for the implementation of the plasma etch of the invention:

copper interconnects such as copper lines, plugs, vias, damascene structures, are created, these interconnect are embedded in a layer of low-k dielectric the surface of the copper interconnects is polished using methods of CMP a plasma etch is applied to the surface of the low-k dielectric after the process of CMP has been completed after the plasma etch has been completed, the semiconductor device that contains the copper interconnect is further processed following a regular processing stream.

Regarding the plasma etch the following observations apply:

of the reducing gases that are used during the plasma etch, the He and $N_2$ gasses act as carrier gasses of the reducing gasses that are uses during the plasma etch, the $H_2$ gasses are the critical gasses; these gasses must be used in order to achieve the objectives of reducing surface scratch, surface dishing and the extent of the occurring erosion pure $H_2$ is not allowed as a reducing gas and must have at least traces of $NH_3$ as previously stated, the surface of the copper structure that is embedded in a low-k dielectric will, after the process of CMP of the surface of the copper has been completed and due to the high selectivity to copper of the slurry that is used during the process of CMP, be lower than the surface of the low-k dielectric in which the copper structure is embedded. The plasma etch of the invention will remove the low-k dielectric film and, in so doing, will improve surface planarity by reducing dishing, erosion and scratch in the surface of the low-k dielectric in order to achieve good performance for the low-k/copper process, direct CMP for low-k material is needed. This because, if a capped oxide is used, the effective dielectric constant k of the dielectric will be increased due to the layer of oxide that remains in place on the surface of the low-k dielectric, thus reducing device performance as low-k dielectrics can be considered organic dielectrics such as SiLK, FLARE and inorganic dielectrics such as black diamond, OSG.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of removing micro scratches in planarized dielectric surfaces covering conductor layers in submicron integrated circuit structure, comprising the steps of:

providing a semiconductor surface, at least one layer of dielectric having been deposited over said semiconductor surface, a pattern of interconnect metal having been created in the surface of said at least one layer of dielectric, a layer of metal having been deposited over the surface of said at least one layer of dielectric, filling said pattern of interconnect metal;

chemical mechanical polishing said layer of metal having been deposited over the surface of said at least one layer of dielectric down to the surface of said pattern of interconnect metal created in the surface of said at least one layer of dielectric, creating a polished surface comprising exposed surfaces of said pattern of interconnect metal, said polished surface further comprising said at least one layer of dielectric; and plasma etching said polished surface.

2. The method of claim 1 wherein said interconnect metal comprises copper.

3. The method of claim 1 wherein said at least one layer of dielectric comprises a low-k dielectric.

4. The method of claim 1 wherein said at least one layer of dielectric comprises a low-k organic dielectric.

5. The method of claim 1 wherein said at least one layer of dielectric comprises a low-k inorganic dielectric.

6. The method of claim 1 wherein chemical mechanical polishing said layer of metal having been deposited over the surface of at least one layer of dielectric comprises a slurry having a polishing rate for copper exceeding a polishing rate for said at least one layer of dielectric by a measurable amount.

7. The method of claim 1 wherein said plasma etching comprises reducing gasses selected from the group consisting of $N_2$—$H_2$ and He—$H_2$ and $NH_3$ and any other reducing gas having a high plasma etch selectivity when applied to a low-k organic or inorganic dielectric material as compared with copper.

8. The method of claim 1 wherein said plasma etch comprises applying a pressure of between about 1 and 10 Torr, a gas flow rate of between about 500 and 5000 sccm, a temperature of between about 300 and 400 degrees C. and a time of plasma etch between about 10 and 180 seconds, the time of plasma etch being variable and established by the surface roughness and the composition of the dielectric film that is being polished.

9. The method of claim 1 wherein said plasma etching said polished surface comprises $H_2$ reducing gasses to which additional reducing gasses are added.

10. The method of claim 1 wherein said plasma etching said polished surface does not comprise pure $H_2$ as a reducing gas and comprises traces of $NH_3$.

11. The method of claim 1 wherein said semiconductor surface is selected from the group of surfaces consisting of semiconductor substrates, printed circuit boards, flex circuits, metallized substrates, glass substrates and semiconductor device mounting support.

12. The method of claim 11 wherein said semiconductor substrate is selected from the group of substrates consisting of semiconductor substrates, ceramic substrates, glass substrates, gallium arsenide substrates, silicon on insulator (SOI) substrates and silicon on sapphire (SOS) substrates.

13. The method of claim 11 wherein said plasma etching said polished surface removes a thickness from the surface of said at least one layer of dielectric, thereby removing surface irregularities including micro scratches from the surface of said at least one layer of dielectric.

14. The method of claim 13 wherein said micro scratches in said at least one layer of dielectric measure between about 0.1 and 0.5 µm deep, said micro scratches having been induced during said chemical mechanical polishing said at least one layer of dielectric.

15. A method of removing micro scratches in planarized dielectric surfaces covering conductor layers in submicron integrated circuit structure, comprising the steps of:

providing a semiconductor surface, at least one layer of low-k dielectric having been deposited over said semiconductor surface, a pattern of interconnect copper having been created in the surface of said at least one layer of dielectric, a layer of copper having been deposited over the surface of said at least one layer of low-k dielectric, filling said pattern of interconnect copper;

chemical mechanical polishing said layer of copper having been deposited over the surface of said at least one layer of low-k dielectric down to the surface of said pattern of interconnect copper created in the surface of said at least one layer of low-k dielectric, creating a polished surface comprising exposed surfaces of said pattern of interconnect copper, said polished surface further comprising said at least one layer of low-k dielectric; and plasma etching said polished surface, said plasma etching comprising $H_2$ reducing gasses to which additional reducing gasses are added, whereby said plasma etching further comprises reducing gasses that comprise traces of $NH_3$.

16. The method of claim 15 wherein said chemical mechanical polishing said layer of copper comprises a slurry having a polishing rate for copper that exceeds a polishing rate for said at least one layer of dielectric by a measurable amount.

17. The method of claim 16 wherein said plasma etching said polished surface comprises reducing gasses selected from the group consisting of $N_2$—$H_2$ and He—$H_2$ and $NH_3$ or any other reducing gas having a high plasma etch selectivity when applied to a low-k organic or inorganic dielectric material when compared with copper.

18. The method of claim 15 wherein said plasma etching said polished surface comprises applying a pressure of between about 1 and 10 Torr, a gas flow rate of between about 500 and 5000 sccm, a temperature of between about 300 and 400 degrees C. and a time of plasma etch between about 10 and 180 seconds, said time of plasma etch being determined by surface roughness and chemical composition of said at least one layer of dielectric that is being polished.

19. The method of claim 15 wherein said semiconductor surface is selected from the group of surfaces consisting of semiconductor substrates, printed circuit boards, flex circuits, metallized substrates, glass substrates and semiconductor device mounting support.

20. The method of claim 19 wherein said semiconductor substrate is selected from the group of substrates consisting of semiconductor substrates, ceramic substrates, glass substrates, gallium arsenide substrates, silicon on insulator (SOI) substrates and silicon on sapphire (SOS) substrates.

21. The method of claim 15 wherein said plasma etching said polished surface removes a thickness from the surface of said at least one layer of dielectric, thereby removing surface irregularities including micro scratches from the surface of said at least one layer of dielectric.

22. The method of claim 21 wherein said micro scratches in said at least one layer of dielectric measure between about 0.1 and 0.5 µm deep, said micro scratches having been induced during said chemical mechanical polishing said at least one layer of dielectric.

* * * * *

UNITED STATES PATENT AND TRADEMARK OFFICE
CERTIFICATE OF CORRECTION

PATENT NO. : 6,350,694 B1  Page 1 of 1
APPLICATION NO. : 09/814038
DATED : February 26, 2002
INVENTOR(S) : Chang et al.

It is certified that error appears in the above-identified patent and that said Letters Patent is hereby corrected as shown below:

Patent face, left column, delete Item (30), as follows,
"(30) Foreign Application Priority Data
Oct. 4, 2000   (JP) ............................ 2000-304520"

Signed and Sealed this

Seventeenth Day of April, 2012

David J. Kappos
*Director of the United States Patent and Trademark Office*